(12) United States Patent
Gill et al.

(10) Patent No.: US 7,881,018 B2
(45) Date of Patent: Feb. 1, 2011

(54) DIFFERENTIAL CURRENT PERPENDICULAR TO PLANE GIANT MAGNETORESISTIVE SENSOR STRUCTURE HAVING IMPROVED ROBUSTNESS AGAINST SPIN TORQUE NOISE

(75) Inventors: Hardayal Singh Gill, Palo Alto, CA (US); Wipul Pemsiri Jayasekara, Los Gatos, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 818 days.

(21) Appl. No.: 11/850,570

(22) Filed: Sep. 5, 2007

(65) Prior Publication Data

US 2009/0059437 A1 Mar. 5, 2009

(51) Int. Cl.
*G11B 5/33* (2006.01)
(52) U.S. Cl. ...................................... 360/314
(58) Field of Classification Search ............... 360/314
See application file for complete search history.

(56) References Cited

U.S. PATENT DOCUMENTS

| | | | | |
|---|---|---|---|---|
| 5,668,688 A | 9/1997 | Dykes et al. | ................ | 360/113 |
| 6,118,638 A | 9/2000 | Knapp et al. | ................ | 360/314 |
| 6,134,089 A | 10/2000 | Barr et al. | ................... | 360/322 |
| 6,185,079 B1 * | 2/2001 | Gill | ......................... | 360/324.2 |
| 6,259,586 B1 | 7/2001 | Gill | ......................... | 360/324.2 |
| 6,480,365 B1 | 11/2002 | Gill et al. | ................ | 360/324.11 |
| 6,480,411 B1 * | 11/2002 | Koganei | ..................... | 365/158 |
| 6,643,103 B1 | 11/2003 | Trindade | .................... | 360/314 |
| 6,819,530 B2 | 11/2004 | Gill | ......................... | 360/314 |
| 6,906,898 B2 | 6/2005 | Kawato | ...................... | 360/314 |
| 6,927,948 B2 | 8/2005 | Gill | ............................ | 360/314 |
| 6,953,601 B2 | 10/2005 | Li et al. | ..................... | 427/131 |
| 7,116,530 B2 * | 10/2006 | Gill | ......................... | 360/324.1 |
| 2002/0075608 A1 * | 6/2002 | Kawato | ...................... | 360/314 |
| 2005/0068683 A1 * | 3/2005 | Gill | ........................... | 360/314 |
| 2005/0264951 A1 | 12/2005 | Gill | ........................... | 360/324.11 |
| 2006/0002032 A1 | 1/2006 | Li et al. | ..................... | 360/315 |

FOREIGN PATENT DOCUMENTS

JP 2003-282999 10/2003

* cited by examiner

*Primary Examiner*—Mark Blouin
(74) *Attorney, Agent, or Firm*—Zilka-Kotab, PC (57) ABSTRACT

A differential giant magnetoresistive sensor for sensing a magnetic signal. The differential sensor has a structure configured to minimize spin torque noise. The differential magnetoresistive sensor includes first and second magnetoresistive sensor elements and a three lead structure including an inner lead sandwiched between the first and second sensor elements and first and second outer leads. each of the sensor elements includes an antiparallel coupled free layer structure with the free layer of each of the sensor elements preferably being positioned near the inner lead. The three lead structure allows sense current to be supplied to the sensor such that electrons travel first through the free layer of each sensor element and then through the pinned layer structure.

20 Claims, 10 Drawing Sheets

DIFFERENTIAL CURRENT PERPENDICULAR TO PLANE GIANT MAGNETORESISTIVE SENSOR STRUCTURE HAVING IMPROVED ROBUSTNESS AGAINST SPIN TORQUE NOISE

FIELD OF THE INVENTION

The present invention relates to differential magnetoresistive sensors and more particularly to a differential giant magnetoresistive sensor that avoids spin torque noise and has a small gap.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

The need for ever increased data density is pushing researches to develop data recording systems that can read and record ever smaller bit lengths in order to increase the density of data recorded on a magnetic medium. This has led a push to decrease the gap size of a read head such as a GMR head. However, the amount by which such gap lengths can be decreased using conventional GMR heads has limitations.

In addition, a problem experienced by magnetoresistive sensors is that they suffer from spin torque noise. As those skilled in the art will appreciate, spin torque noise occurs when electrons pass from one magnetic layer to another magnetic layer through a spacer. The polarization of the electrons and the magnetization of the free layer affect one another. The spin torque from polarized electrons can destabilize the magnetization of the free layer, causing spin torque noise. This will adversely affect the signal to noise ratio of a sensor, making the CPP GMR impractical.

Therefore, there is a strong felt need for a magnetoresistive sensor design that can dramatically decrease bit length resolution, and therefore increase data density. In addition, there is a need for a sensor that can significantly reduced or eliminate spin torque noise.

SUMMARY OF THE INVENTION

The present invention provides a differential magnetoresistive sensor that can read extremely small data bits, while minimizing the effects of spin torque noise. The differential sensor includes first and second magnetoresistive elements and an inner electrically conductive lead disposed therebetween. First and second outer electrically conductive leads are also provided at the top and bottom of the differential sensor. Each sensor element has a free layer structure that includes first and second magnetic layers that are antiparallel coupled across a non-magnetic spacer layer sandwiched therebetween.

The lead arrangement advantageously allows sense current to flow such that electrons travel from the inner lead, through each of the sensor elements to the outer leads. Furthermore, the sensor elements can be arranged so that the free layer structure of each sensor element is located adjacent to the inner lead. This allows the electrons to travel first through the free layer structure and then through the pinned layer structure. It has been found that having the electrons flow through the free layer structure first, and then through the pinned layer greatly reduces spin torque noise in most GMR structures. However there could be situations where having electrons flow through the pinned layer first and then the free layer structure would provide better reduction of spin torque noise. A differential sensor structure according to the present invention accommodates this situation as well by allowing the sense current to flow such that electrons can pass through the pinned layer of each sensor element before passing through the free layer structure.

As mentioned above, each sensor element has a free layer structure that includes first and second magnetic layers that are antiparallel coupled across a non-magnetic coupling layer. This free layer structure also greatly reduces spin torque noise by cancelling out the spin torque effect of each of the magnetic layers of the free layer structure.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
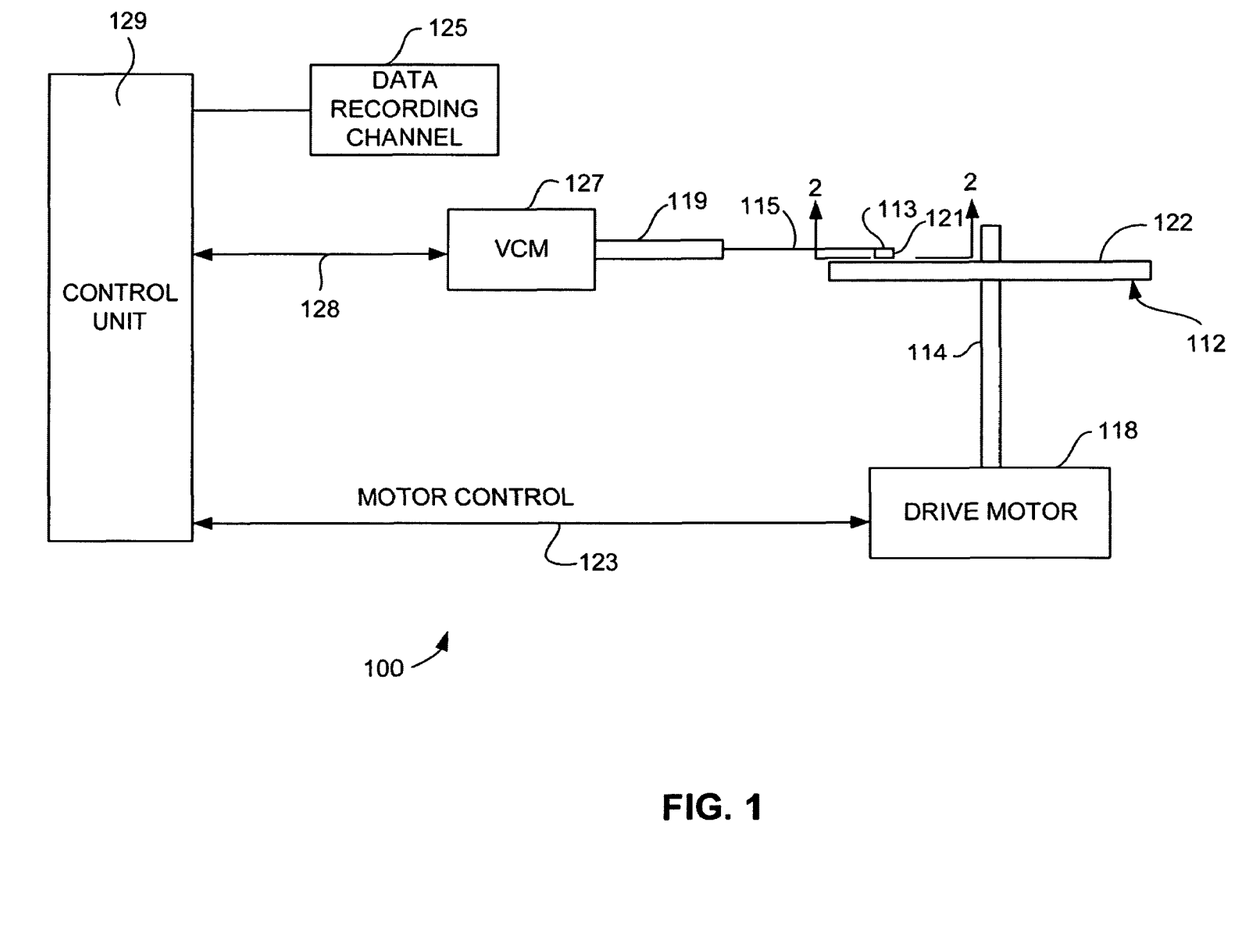
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
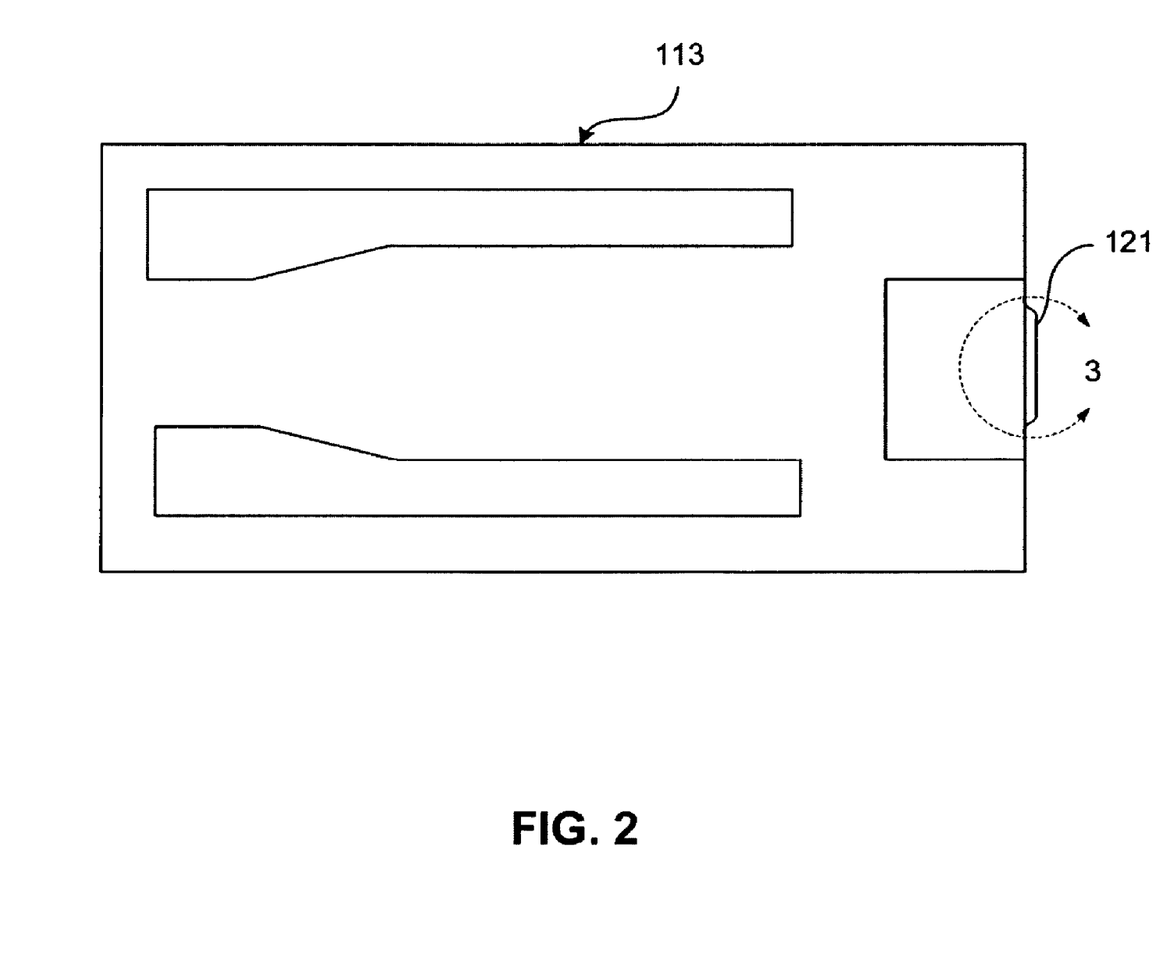
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
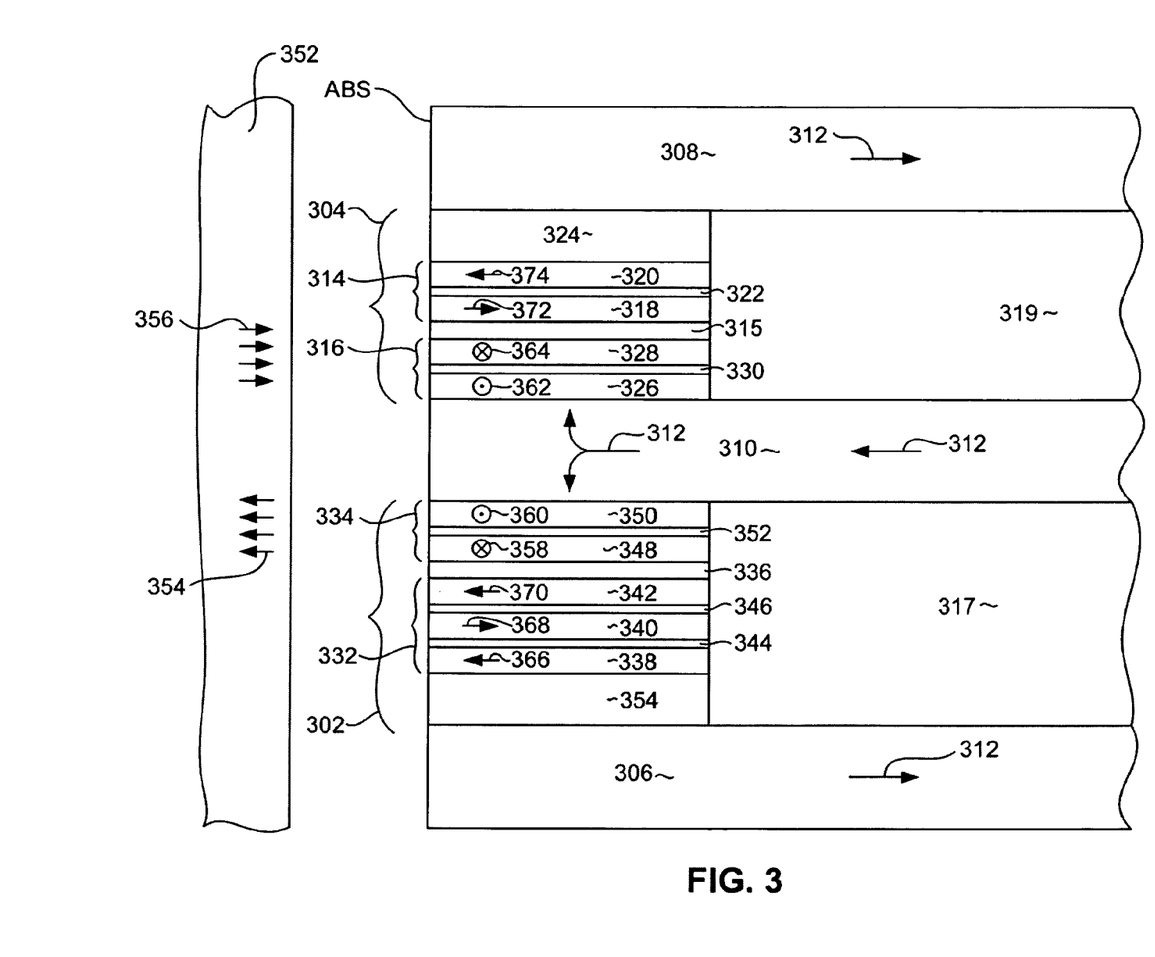
FIG. 3 is an enlarged ABS view taken from circle 3 of FIG. 2 rotated 90 degrees counterclockwise.

With reference now to FIG. 3, a differential, current perpendicular to plane, giant magnetoresistive sensor structure 300 according to an embodiment of the invention includes first and second sensor elements 302, 304, which can be current perpendicular to plane giant magnetoresistive sensors (CPP GMR sensors). The differential sensor structure 300 is a three lead structure having first and second outer leads 306, 308 located at the top and bottom of the sensor structure 300, and an inner lead 310 located between the first and second sensor elements 302, 304. The outer leads 306, 308 can be connected with one another in a region outside of the sensor structure 300 shown in FIG. 3. The sensor 300 is connected with circuitry (not shown in FIG. 3) that allows a sense current 312 to flow in a desired direction through the inner lead 310, through each of the sensor elements 302, 304 and out through the outer leads 306, 308. Preferably, the current 312 flows so that electrons travel first through the inner lead 310, then out through the outer leads 306, 308 as indicated by arrows 312. Alternatively, the sense current 312 could flow in an opposite direction so that electrons flow from the outer leads 306, 308 to the inner lead 310 if that flow of electrons has been found to better reduce spin torque noise for a particular sensor design. An insulation layer 317 can be provided beyond the back edge (stripe height) of the first sensor element 302, between the leads 306, 310 to prevent shorting between these leads. Similarly, a layer of insulation 319 can be provided beyond the back edge of the sensor element 304, between the leads 310, 308 to prevent shorting between the leads 310, 308.

With reference still to FIG. 3, the second sensor element 304 includes a magnetically pinned structure 314 and a magnetic free layer structure 316. Preferably, the free layer structure 316 is located toward the center of the sensor structure 300 (i.e. toward the first sensor element 302), whereas the pinned layer structure is located away from the center of the sensor structure 300 and away from the first sensor element 302. A non-magnetic, spacer layer 315 such as Cu or Cu-Ox is sandwiched between the free layer 316 and the pinned layer 314.

The pinned layer structure 314 preferably includes first and second magnetic layers 318, 320, which can be constructed of a material such as CoFe or some other magnetic material, and which are antiparallel coupled across a non-magnetic coupling layer such as Ru that is sandwiched between the layers 318, 320. One of the magnetic layers (e.g. layer 320) can be exchange coupled with a layer of antiferromagnetic material (AFM layer) 324 such as Pt—Mn or Ir—Mn.

With reference still to FIG. 3, the free layer structure 316 is an AP coupled or "synthetic" free layer structure that includes first and second magnetic layers 326, 328 that are antiparallel coupled across a non-magnetic coupling layer 330, such as Ru, sandwiched between the magnetic layers 326, 328. The magnetic layers 326, 328 can each be constructed of one or more layers of magnetic material such as Co, Co—Fe, Ni—Fe etc. The coupling layer 330 preferably has a thickness of about 4 Angstroms, in order to provide effective antiparallel magnetic coupling between the magnetic layers 326, 328. One of the magnetic layers 328 has a magnetic thickness that is greater than the other magnetic layer 326. Magnetic thickness is the magnetic moment of a material layer, multiplied by the thickness of the layer. Constructing the free layer structure 316 such that one of the magnetic layers 328 has a larger magnetic thickness than the other magnetic layer 326, allows the free layer to respond to an external magnetic field by creating a net magnetic moment for the free layer structure 316 as a whole.

With reference still to FIG. 3, the first sensor element 302 has a structure similar to that of the second sensor element 304. The first sensor element has a pinned layer structure 332, a free layer structure 334 and a non-magnetic spacer layer 336. In FIG. 3 it can be seen that the pinned layer structure includes three magnetic layers 338, 340, 342, whereas the pinned layer structure 314 of the second sensor element 304 only included two magnetic layers 318, 320. The reason for including three magnetic layers 338, 340, 342 in the pinned layer 332 will become apparent below. The magnetic layers 338, 340, 342 can be constructed of, for example, Co—Fe and are each separated from one another by non-magnetic antiparallel coupling layers 344, 346, which can be constructed of a material such as Ru and can be about 4 Angstroms thick to promote strong antiparallel coupling between the layers 338, 340, 342. The outermost magnetic layer 338 of the pinned layer structure 332 is exchange coupled with a layer of antiferromagnetic material (AFM layer) 354 such as PtMn or IrMn.

The free layer structure 334 of the first sensor element 302 is an antiparallel coupled free layer structure that includes first and second magnetic layers 348, 350, which are antiparallel coupled across an antiparallel coupling layer 352. The magnetic layers 348, 350 can include one or more layers of Co, Co—Fe, Ni—Fe, etc. One of the magnetic layers 348 of the free layer structure 334 has a larger magnetic thickness than the other magnetic layer 350. As described above, this allows the free layer to respond to an external magnetic field.

The differential GMR sensor 300 detects a magnetic transition in a magnetic medium 352 by detecting a location where first and second magnetizations 354, 566 are oriented in opposite directions to one another. Therefore, the sensor 300 is constructed such that when the magnetic response of the free layers 334, 316 of the first and second GMR elements 302, 304 are in opposite directions, the signals from each of the sensors 302, 304 are additive.

To this end, the magnetic layers 348, 350 and 326, 328 of each of the free layer structures 334, 316 have magnetizations that are biased in directions parallel with the air bearing surface (ABS) and perpendicular to the plane of the page in FIG. 3. Although the magnetizations 358, 360, 362, 364 are biased parallel with the ABS, they are free to move in response to an external magnetic field such as the magnetic fields 354, 356 from the magnetic medium 352.

The magnetic layers 348, 350 are antiparallel coupled across the coupling layer 352 so that the magnetizations 358, 360 are in opposite directions (i.e. antiparallel with one another). Similarly, the magnetic layers 326, 328 are antiparallel coupling across the coupling layer 330 so that the magnetizations 362, 364 are in opposite directions to one another (i.e. are antiparallel to one another). Furthermore, the magnetizations 358, 360, 362, 364 are oriented such that the magnetizations 358, 364 of the magnetic layers 348, 326 closest to the spacer layers 336, 315 are in the same direction as one another.

As mentioned above, the magnetic thickness of one of the magnetic layers of each of the free layer structures 334, 316 is larger than the other. For example, the magnetic thickness of layer 328 is larger than that of layer 326 and the magnetic thickness of layer 348 is larger than that of layer 350. This causes each of the free layers 334, 316 to have a net magnetic moment, allowing the free layer structures 334, 316 to respond to a magnetic field 354, 356 from a magnetic medium 352.

With reference still to FIG. 3, the sensor 300 is configured so that one of the pinned layers structures 316 has an even number of magnetic layers 326, 328 whereas the other pinned layer structure 332 has an odd number of magnetic layers 338, 340, 342. Preferably, the pinned layer 332 has three magnetic layers 338, 340, 342, whereas the pinned layer structure 316 has two magnetic layers 326, 328. The magnetic layers 338, 340, 342 and 318, 320 are antiparallel coupled across the non-magnetic antiparallel coupling layers 344, 346, 322. This causes the pinned layer structure 332 to have antiparallel magnetizations 366, 368, 370. Similarly, the pinned layer 316 has antiparallel magnetizations 372, 374.

Within each pinned layer 332, 314 the magnetic layer 338, 320 closest to the adjacent AFM layer 354, 324 is exchange coupled with the AFM layer 354, 324. This strongly pins the magnetization 366, 374 of that magnetic layer 338, 320. Setting of the pinned layer can be accomplished by heating the sensor 300 to a temperature near or above the blocking temperature of the AFM layer 354, 324 and then applying a magnetic field to the sensor 300. While the magnetic field is still applied, the sensor 300 is cooled below this blocking temperature, and the magnetizations 338, 320 are set by exchange coupling with the AFM layer 354, 324. Antiparallel coupling with the other magnetic layers 340, 342 and 318 pins the magnetizations of those layers.

In order for the two GMR sensors elements 302, 340 to have additive GMR effects when sensing opposite magnetic fields 354, 556 the magnetizations of pinned magnetic layers 342, 318 (closest to the spacer layer 336, 315 must be in opposite directions. By constructing one pinned layer structure 316 with two magnetic layers 320, 318, and the other pinned layer structure 322 with three magnetic layers 338, 340, 342, the pinned magnetic layers 342, 318 can have magnetizations 370, 372 that are oriented opposite to one another, while also allowing the pinned layer structures 332, 314 to be annealed in the same annealing step. In addition, this allows the AFM layers 354, 324 to be constructed of the same material, such as Pt—Mn or Ir—Mn.

The present invention provides a differential GMR sensor 300 that minimizes the effects of spin torque noise. As discussed above, spin torque noise degrades the signal from a sensor to such a point that it can render the reading of very small signals impossible. The present invention prevents spin torque noise by the use of several mechanisms that work together synergistically. For example, the direction of current flow through a spin valve (whether the current travels through the free layer first and then the pinned layer or vise versa) greatly affects the production of spin torque noise. With reference to FIG. 3, in a possible embodiment of the invention it has been found that spin torque noise can be reduced if the sense current flows first through the free layer structures 334, 316 before flowing through the pinned layer structures 332, 314 of each sensor element 302, 304. The three lead structure of the sensor 300 described with reference to FIG. 3 advantageously allows the sense current 312 to travel in such a manner that electrons travel first through the free layer structure 334, 316 of each sensor element 302, 304, and then through the pinned layer structure 332, 314 of each sensor element. Having the electrons travel first through the free layer structures 316, 334 and then through the pinned layer structures 314, 332 prevents the spin of the electrons from being affected by traveling through the magnetized pinned layers 314, 332 prior to traveling through the free layers 316, 334. This arrangement, therefore, greatly reduces the spin torque noise experienced by the sensor 300.

Another mechanism that reduces the spin torque noise of the sensor 300, is the use of the anitparallel coupled (AP coupled) free layers 334, 316. By providing each free layer structure 334, 316 with an anitparallel coupled structure such as that shown, the spin torque effect on the electrons is essentially, nearly cancelled out as the electrons pass through the oppositely magnetized layers 348, 350 and 328, 326 of the free layer structures 334, 316.

Figure 4:
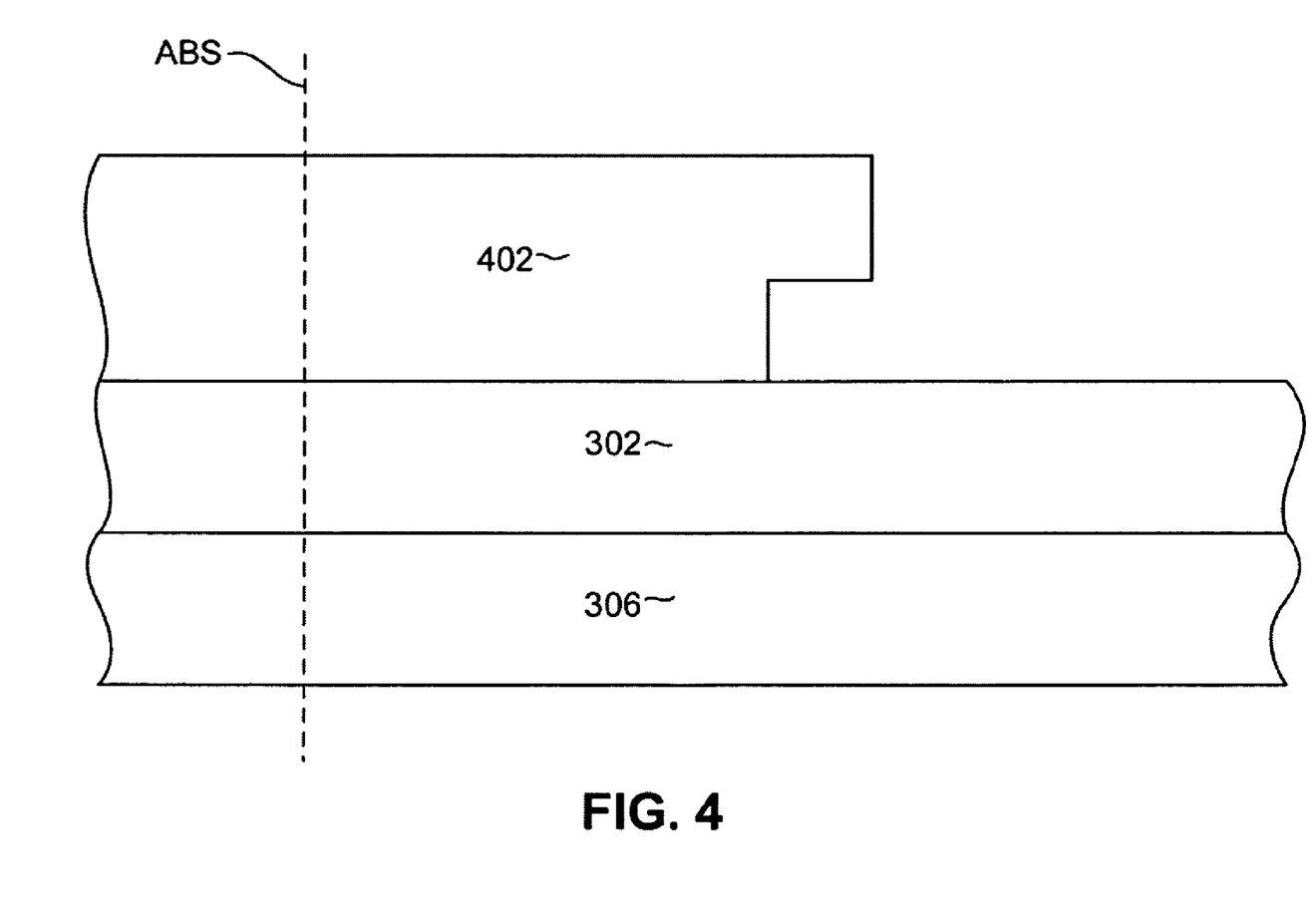
FIGS. 4-10 are views of a showing a sensor in various intermediate stages of manufacture in order to illustrate a method of manufacturing a magnetoresistive sensor according to an embodiment of the invention.

With reference now to FIGS. 4-10, a method is described for constructing a magnetoresistive sensor according to an embodiment of the invention. With particular reference to FIG. 4, an electrically conductive lead layer 306 is formed, and a plurality of sensor layers is deposited full film to form a first sensor stack 302. The sensor stack 302 can include layers discussed with reference to FIG. 3 that make up the first sensor element 302. A mask structure 402 is then formed over the first sensor stack 302.

Figure 5:
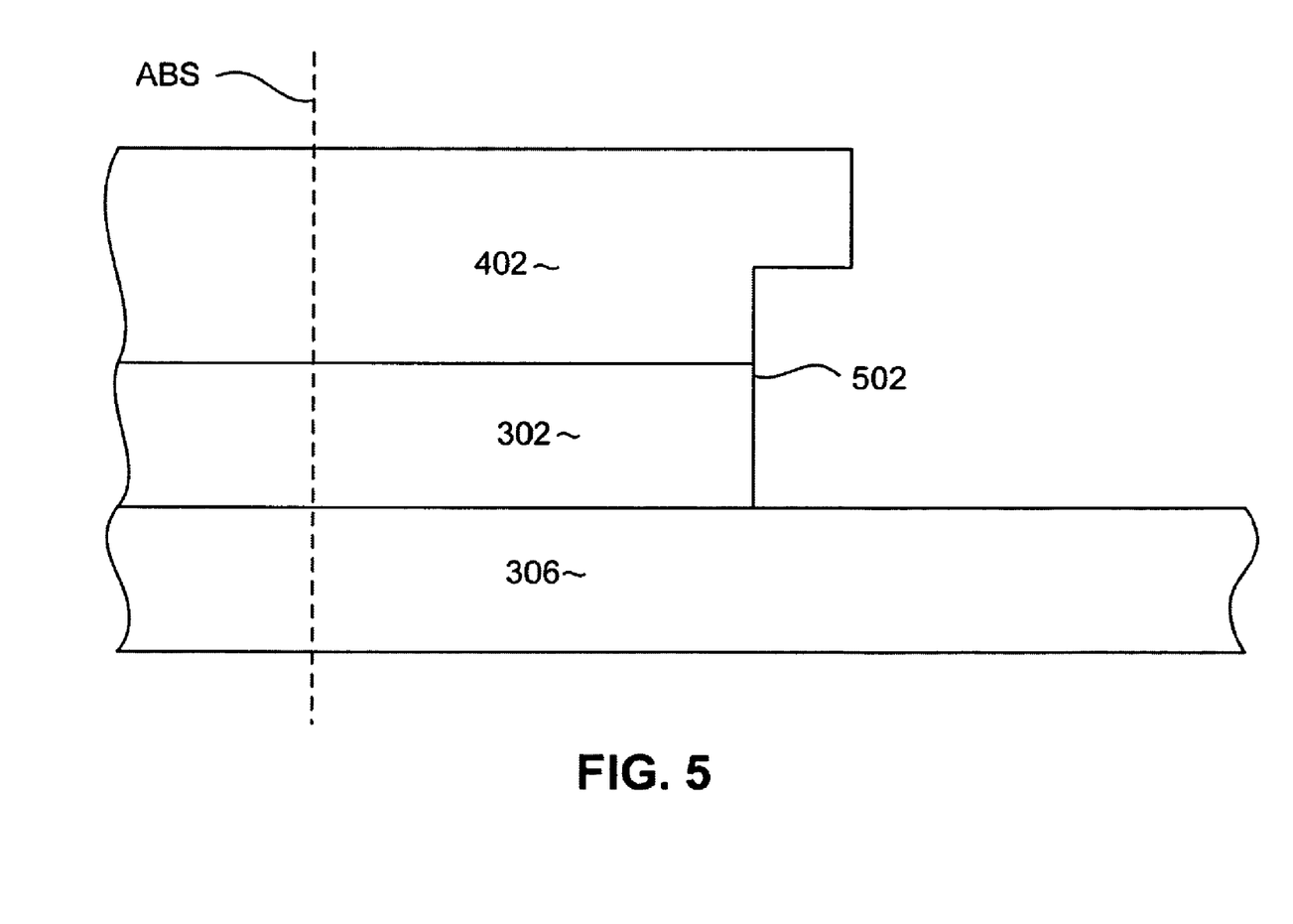
Figure 6:
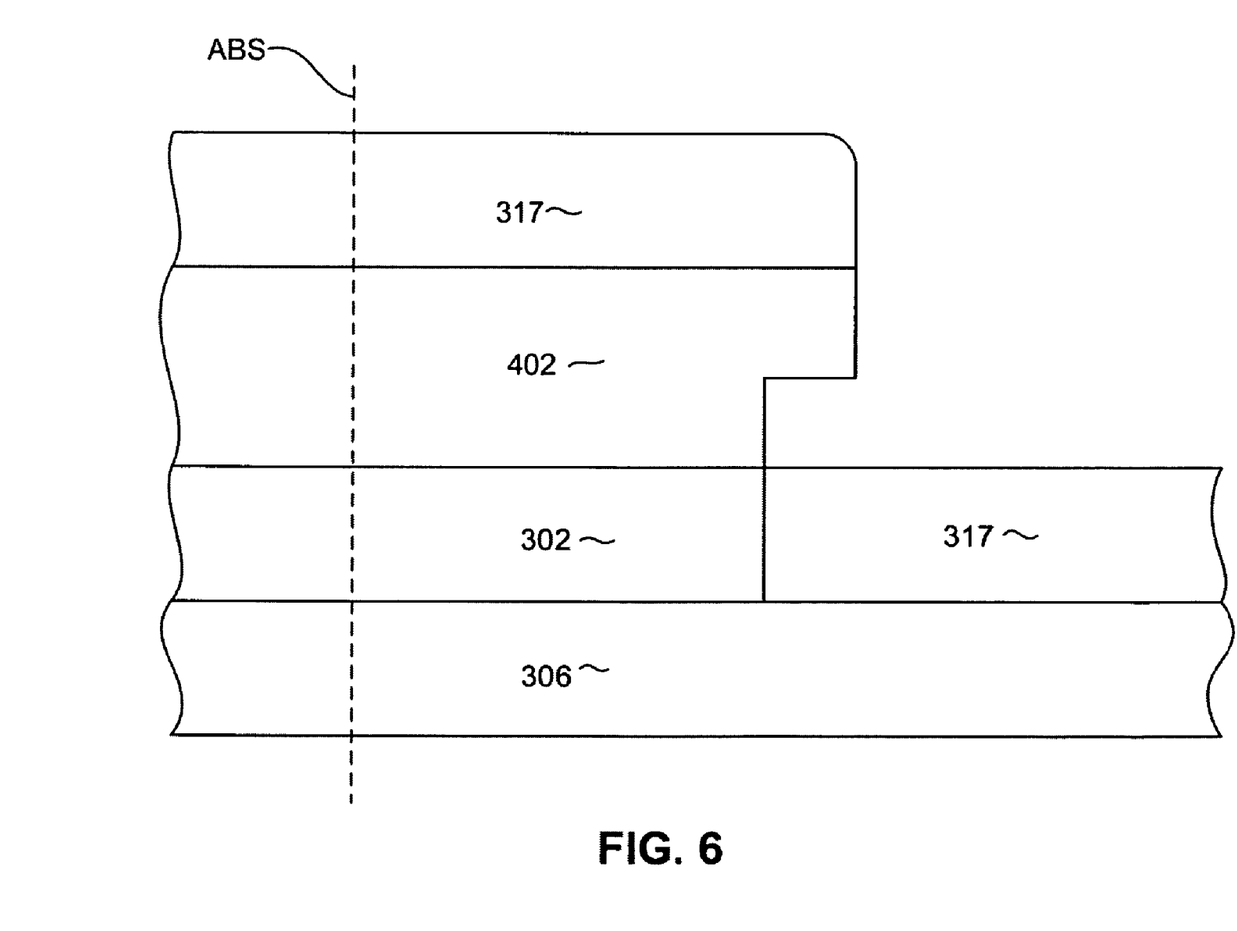

Then, with reference to FIG. 5, a material removal process such as ion milling is performed to remove portions of the sensor stack 302 that are not protected by the mask structure 402. This material removal process defines the back edge or stripe height 502 of the first sensor element 302. Then, an electrically insulating material 602 such as alumina is deposited. The mask 402 can then be lifted off. The mask structure can be a bi-layer mask structure such as that shown in order to facilitate lift off of the mask after the insulation layer 317 has been deposited.

Figure 7:
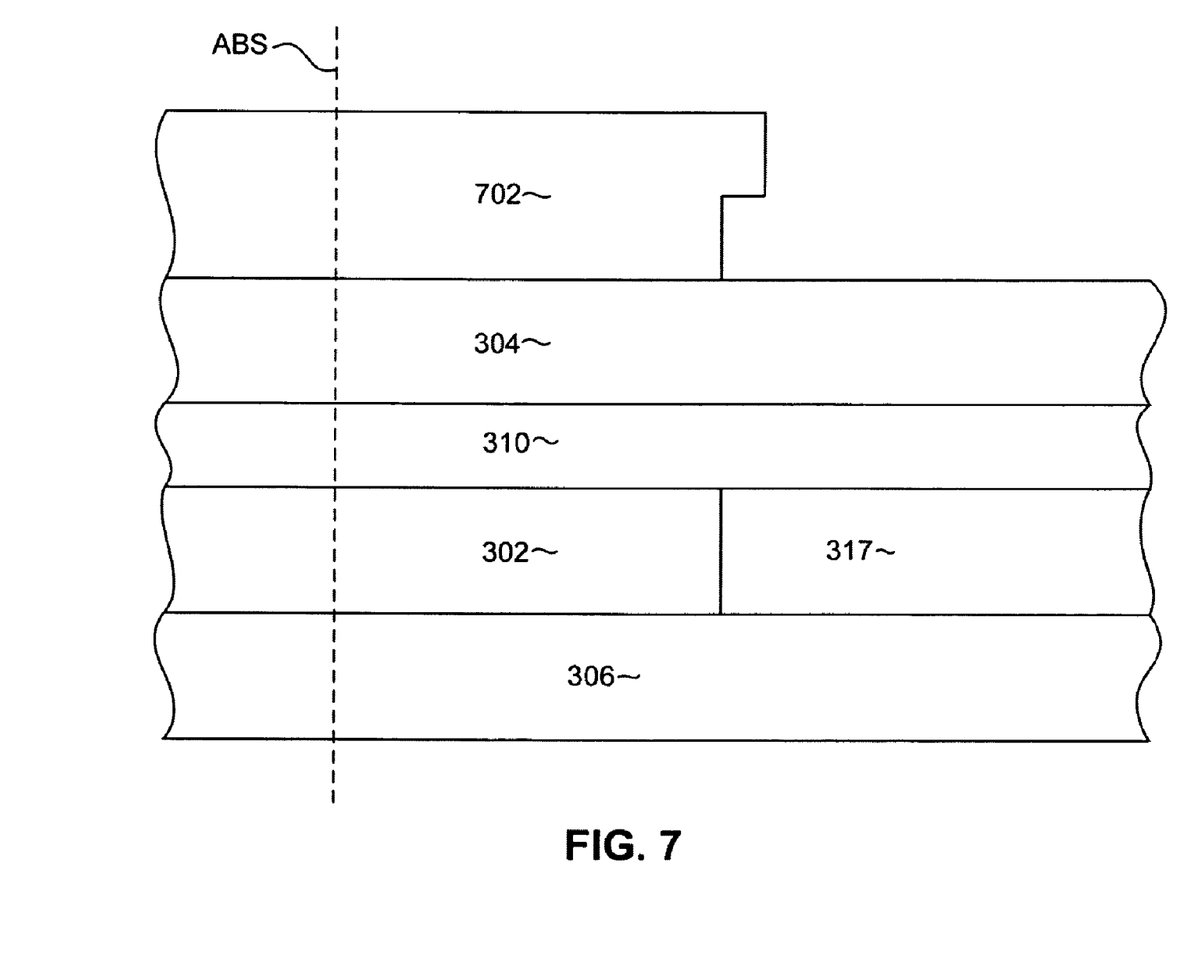

With reference to FIG. 7, another layer of electrically conductive lead material 310 can be deposited followed by a second sensor stack 304. The second sensor stack 304 can include layers that make up the second sensor element 304 described with reference to FIG. 3. A second mask structure 702 can then be formed over the second sensor stack 304.

Figure 8:
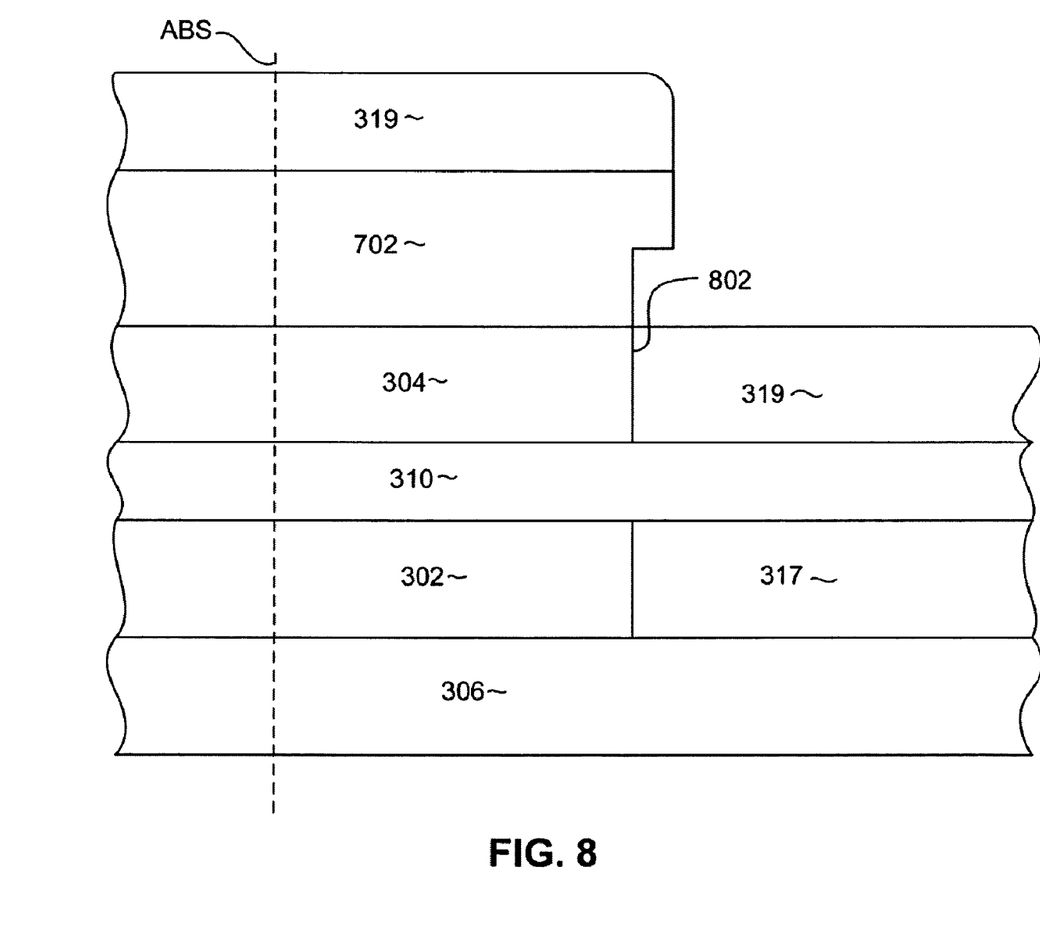

Then, with reference to FIG. 8 another material removal process can be performed to define a back edge or stripe height 802 of the second sensor stack 304. An electrically insulating material 319 such as alumina can then be deposited. The mask 702 can then be lifted off, resulting in a structure such as that shown in FIG. 9.

Figure 9:
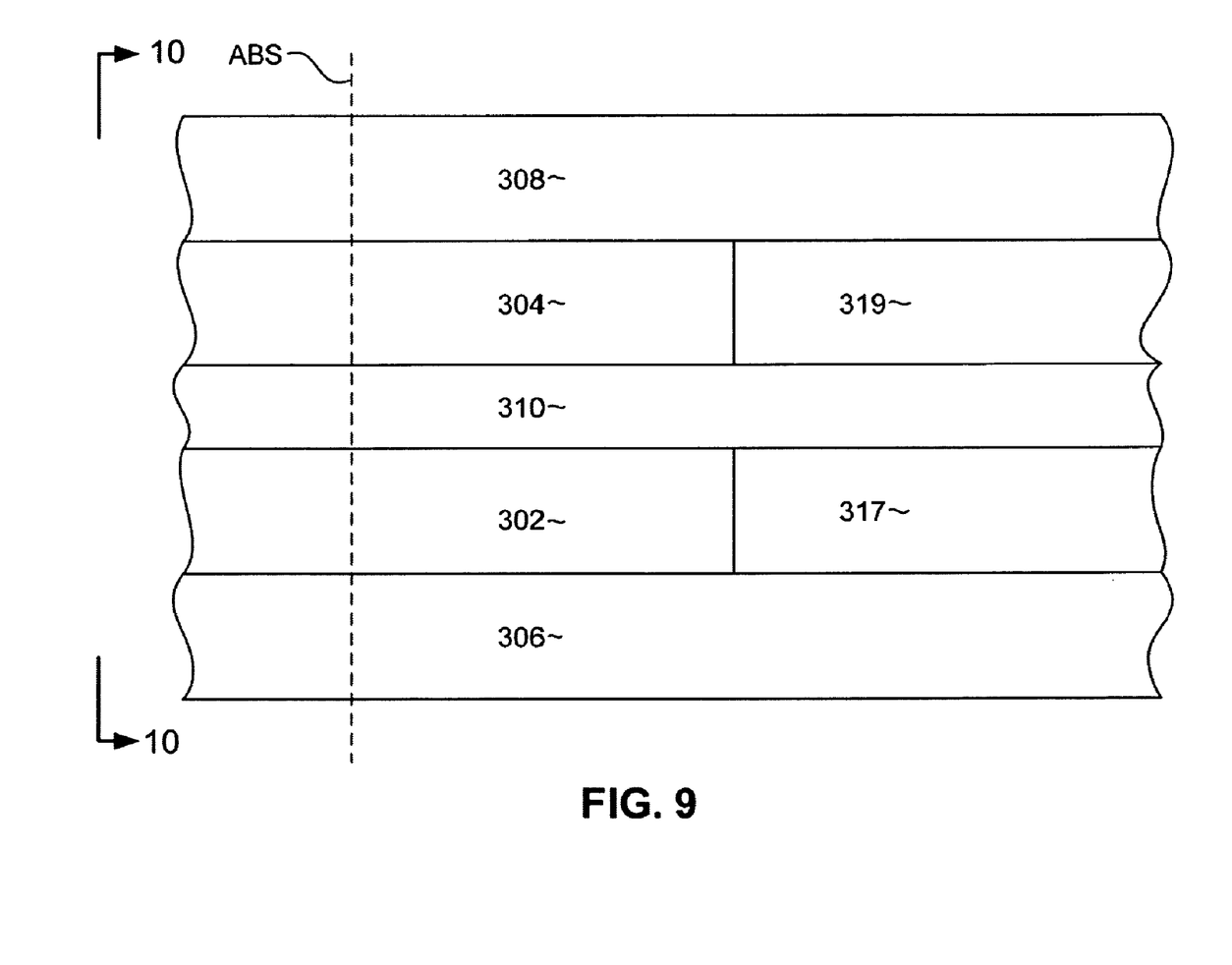
Figure 10:
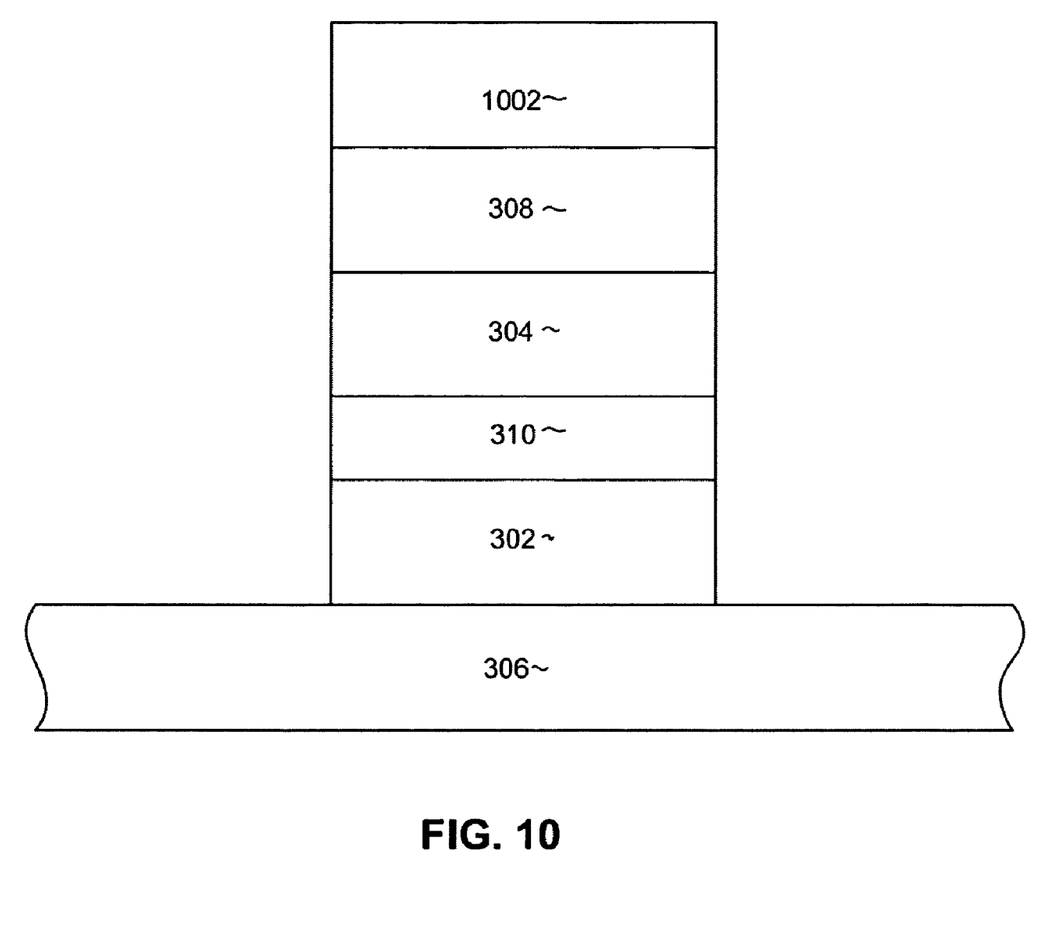

FIG. 10 is a sectional view taken from a direction indicated by arrows 10-10 of FIG. 9. With reference then to FIG. 10, a third mask structure 1002 is formed and configured to define a sensor width. Another material removal process such as ion milling can then be performed to remove material not protected by the mask 1002 in order to define the width of the sensor.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A differential, giant magnetoresistive sensor, comprising:
 a first magnetoresistive sensor element;
 a second magnetoresistive sensor element;
 an inner electrically conductive lead sandwiched between the first and second magnetoresistive sensor elements;
 a first outer electrically conductive lead, electrically connected with the first magnetoresistive sensor element at a location distal from the second magnetoresistive sensor element;
 a second outer electrically conductive lead, electrically connected with the second magnetoresistive sensor element at a location distal from the first magnetoresistive sensor element;
 each of the first and second magnetoresistive sensor elements further comprising:
 a magnetic free layer structure that includes first and second magnetic layers that are antiparallel coupled across a non-magnetic, antiparallel coupling layer that is sandwiched between the first and second magnetic layers.

2. A differential sensor as in claim 1 wherein the magnetic free layer structure of each of the first and second magnetoresistive sensor elements is located adjacent to the inner, electrically conductive lead.

3. A differential sensor as in claim 1 wherein each of the free layer structures is located adjacent to the inner, electrically conductive lead and wherein each free layer structure has a magnetic layer closest to the inner lead has magnetic thickness that is less than a magnetic thickness of a magnetic layer further from the inner electrically conductive lead.

4. A differential sensor as in claim 1 wherein the inner electrically conductive lead and the first and second outer electrically conductive leads are connected with circuitry that causes electrons to flow from the inner electrically conductive lead, through the first and second magnetoresistive sensor elements to the outer electrically conductive leads.

5. A magnetoresistive sensor as in claim 1 wherein the first and second electrically conductive outer leads are electrically connected with one another in a region removed from the differential sensor.

6. A magnetoresistive sensor as in claim 1 wherein the free layer structure of each of the sensor elements has a first magnetic layer located adjacent to the inner lead, and wherein the magnetizations of the first magnetic layers are biased in the same direction.

7. A differential giant magnetoresistive sensor, comprising:
 a first magnetoresistive element, comprising:
 a first free layer structure including first and second magnetic layers antiparallel coupled across a first non-magnetic coupling layer sandwiched therebetween;
 a first pinned layer structure including third, fourth and fifth magnetic layers, antiparallel coupled with one another by second and third non-magnetic coupling layers sandwiched therebetween; and
 a first non-magnetic spacer layer sandwiched between the first free layer structure and the first pinned layer structure;
 a second magnetoresistive element, comprising:
 a second free layer structure including sixth and seventh magnetic layers and a fourth non-magnetic coupling layer sandwiched therebetween;
 a second pinned layer structure including eighth and ninth magnetic layers and a fifth non-magnetic coupling layer sandwiched therebetween; and a second non-magnetic spacer layer sandwiched between the second free layer structure and the second pinned layer structure;

an inner electrically conductive lead sandwiched between first and second magnetoresistive elements;

a first outer lead, electrically connected with the first magnetoresistive element such that the first magnetoresistive element is sandwiched between the inner electrically conductive lead and the first outer electrically conductive lead; and a second outer lead, electrically connected with the second magnetoresistive element such that the second magnetoresistive element is sandwiched between the inner electrically conductive lead and the second outer electrically conductive lead.

8. A differential sensor as in claim 7, wherein:

the $5^{th}$ magnetic layer is located adjacent to the first non-magnetic spacer layer and has a magnetization that is pinned in a first direction perpendicular to an air bearing surface; and the $8^{th}$ magnetic layer is located adjacent to the second non-magnetic spacer layer and has a magnetization that is pinned in a second direction that is opposite to the first direction.

9. A differential sensor as in claim 7 wherein the first and second free layers are located adjacent to the inner lead.

10. A differential sensor as in claim 7, wherein:

the $5^{th}$ magnetic layer is located adjacent to the first non-magnetic spacer layer and has a magnetization that is pinned in a first direction perpendicular to an air bearing surface;

the $8^{th}$ magnetic layer is located adjacent to the second non-magnetic spacer layer and has a magnetization that is pinned in a second direction that is opposite to the first direction;

the first magnetic layer magnetic layer is located adjacent to the first non-magnetic spacer layer and has a magnetization that is biased in a third direction that is parallel to the air bearing surface; and the $7^{th}$ magnetic layer is located adjacent to the second non-magnetic spacer layer and has a magnetization that is biased in the third direction.

11. A magnetoresistive sensor as in claim 7 wherein the inner electrically conductive lead and the first and second outer leads are connected with circuitry that supplies a sense current such that electrons travel from the inner lead through the first and second magnetoresistive sensor elements to the first and second outer electrically conductive leads.

12. A differential sensor as in claim 11 wherein the first and second outer electrically conductive leads are connected with one another in a region removed from the differential sensor.

13. A differential sensor as in claim 7 further comprising a first layer of antiferromagnetic material exchange coupled with a magnetic layer of the first pinned layer structure and a second layer of antiferromagnetic material exchange coupled with a magnetic layer of the second pinned layer structure.

14. A differential sensor as in claim 13 wherein the first and second layers of antiferromagnetic material comprises the same material.

15. A differential sensor as in claim 7 further comprising a first layer of antiferromagnetic material exchange coupled with the third magnetic layer and a second layer of antiferromagnetic material that is exchange coupled with the $9^{th}$ magnetic layer.

16. A differential sensor as in claim 7 further comprising:

a first layer of antiferromagnetic material exchange coupled with the third magnetic layer to pin a magnetization of the third magnetic layer in a first direction that is perpendicular with an air bearing surface;

a second layer of antiferromagnetic material exchange coupled with the ninth magnetic layer to pin a magnetization of the ninth magnetic layer in the first direction and wherein:

the fourth magnetic layer is antiparallel coupled with the third magnetic layer to have a magnetization that is pinned in a second direction that is perpendicular to the first direction;

the fifth magnetic layer is antiparallel coupled with the $4^{th}$ magnetic layer to have a magnetization that is pinned in the first direction; and the eighth magnetic layer is antiparallel coupled with the ninth magnetic layer to have a magnetization that is pinned in the second direction.

17. A differential sensor as in claim 16 wherein the fifth magnetic layer is located adjacent to the first non-magnetic spacer layer and the eighth magnetic layer is located adjacent to the second non-magnetic spacer layer.

18. A differential sensor as in claim 16 wherein:

the wherein the first magnetic layer is located adjacent to the first non-magnetic spacer layer and has a magnetization that is biased in a third direction that is parallel with the air bearing surface; and the seventh magnetic layer is located adjacent to the second non-magnetic spacer layer and has a magnetization that is biased in the third direction.

19. A magnetic data recording system:

a housing;

a magnetic medium movably mounted within the housing;

an actuator;

a slider connected with the actuator for movement adjacent to a surface of the magnetic medium; and a differential, giant magnetoresisive sensor connected with the slider, the differential, giant magnetoresistive sensor further comprising:

a first magnetoresistive sensor element;

a second magnetoresistive sensor element;

an inner electrically conductive lead sandwiched between the first and second magnetoresistive elements;

a first outer electrically conductive lead, electrically connected with the first magnetoresistive sensor element at a location distal from the second magnetoresistive sensor element;

a second outer electrically conductive lead, electrically connected with the second magnetoresistive sensor element at a location distal from the first magnetoresistive sensor element;

each of the first and second magnetoresistive sensor elements further comprising:

a magnetic free layer structure that includes first and second magnetic layers that are antiparallel coupled across a non-magnetic, antiparallel coupling layer that is sandwiched between the first and second magnetic layers.

20. A magnetic data recording system:

a housing;

a magnetic medium movably mounted within the housing;

an actuator;

a slider connected with the actuator for movement adjacent to a surface of the magnetic medium; and a differential giant magnetoresistive sensor connected with the slider, the differential giant magnetoresistive sensor further comprising:
    a first magnetoresistive element, comprising:
        a first free layer structure including first and second magnetic layers antiparallel coupled across a first non-magnetic coupling layer sandwiched therebetween;
        a first pinned layer structure including third, fourth and fifth magnetic layers, antiparallel coupled with one another by second and third non-magnetic coupling layers sandwiched therebetween; and
        a first non-magnetic spacer layer sandwiched between the first free layer structure and the first pinned layer structure;
    a second magnetoresistive element, comprising:
        a second free layer structure including sixth and seventh magnetic layers and a fourth non-magnetic coupling layer sandwiched therebetween;
        a second pinned layer structure including eighth and ninth magnetic layers and a fifth non-magnetic coupling layer sandwiched therebetween; and
        a second non-magnetic spacer layer sandwiched between the second free layer structure and the second pinned layer structure;
    an inner electrically conductive lead sandwiched between first and second magnetoresistive elements;
    a first outer lead, electrically connected with the first magnetoresistive element such that the first magnetoresistive element is sandwiched between the inner electrically conductive lead and the first outer electrically conductive lead; and
    a second outer lead, electrically connected with the second magnetoresistive element such that the second magnetoresistive element is sandwiched between the inner electrically conductive lead and the second outer electrically conductive lead.

* * * * *